United States Patent [19]
Lopez

[11] Patent Number: 5,979,037
[45] Date of Patent: *Nov. 9, 1999

[54] MOUNTING ASSEMBLY AND METHOD FOR LOCATING AND ASSEMBLING PARTS WITH A TIGHT PRESS FIT

[75] Inventor: Michael Andrew Lopez, San Diego, Calif.

[73] Assignees: Sony Corporation, Tokyo, Japan; Sony Electronics, Inc., Park Ridge, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/796,114

[22] Filed: Feb. 6, 1997

[51] Int. Cl.[6] ....................................................... B23P 19/02
[52] U.S. Cl. ............................ 29/525; 174/66; 174/72 B; 174/138 G
[58] Field of Search ........................ 29/525; 174/138 G, 174/72 B, 66

[56] References Cited

U.S. PATENT DOCUMENTS

| | | |
|---|---|---|
| 3,155,808 | 11/1964 | Wiley ........................................ 174/66 |
| 3,644,965 | 2/1972 | Kahn . |
| 3,815,200 | 6/1974 | Adams . |
| 4,019,638 | 4/1977 | Miller . |
| 4,244,546 | 1/1981 | Mertes et al. . |
| 4,261,189 | 4/1981 | Brumfield, Jr. et al. ................. 174/66 |
| 4,697,774 | 10/1987 | Sarton et al. . |
| 4,785,508 | 11/1988 | Takeda . |
| 4,852,230 | 8/1989 | Yu ............................................. 29/525 |
| 5,035,494 | 7/1991 | Foldenauer .............................. 29/525 |
| 5,203,595 | 4/1993 | Borzone et al. . |
| 5,267,786 | 12/1993 | Aisley . |
| 5,344,060 | 9/1994 | Gravener et al. . |
| 5,365,062 | 11/1994 | Saffari et al. . |
| 5,478,145 | 12/1995 | Kamachi . |
| 5,553,964 | 9/1996 | Rouillot .................................... 29/525 |
| 5,618,129 | 4/1997 | Skarivoda . |
| 5,651,696 | 7/1997 | Jennison . |
| 5,671,124 | 9/1997 | Ho . |
| 5,727,761 | 3/1998 | Ho . |

*Primary Examiner*—Daniel W. Howell
*Assistant Examiner*—Monica Smith
*Attorney, Agent, or Firm*—Ronald P. Kananen; Rader, Fishman & Grauer

[57] ABSTRACT

A mounting assembly and method for locating and assembling parts with a tight press fit uses an intentional design interference between two mating parts. Because of the interference fit, material is "crushed" or compressed when one mating part, such as a button frame, is forced upon the other mating part, such as a cabinet, and a tight fit is created. The interference fit is provided between first and second bosses and first and second mating holes, respectively, on opposite sides of each of the first and second bosses along a respective first axis, but not along a second axis that extends between the first and second bosses. Thus, a greater design tolerance is permitted in a direction between the first and second bosses and between the first and second mating holes, respectively. A third assembly part, such as a light guide, can be sandwiched between the first and second mating parts. The mounting assembly according to the invention reduces production costs and complexity involved with conventional assembly methods that use glue, screws, or other conventional fastening arrangements.

20 Claims, 4 Drawing Sheets

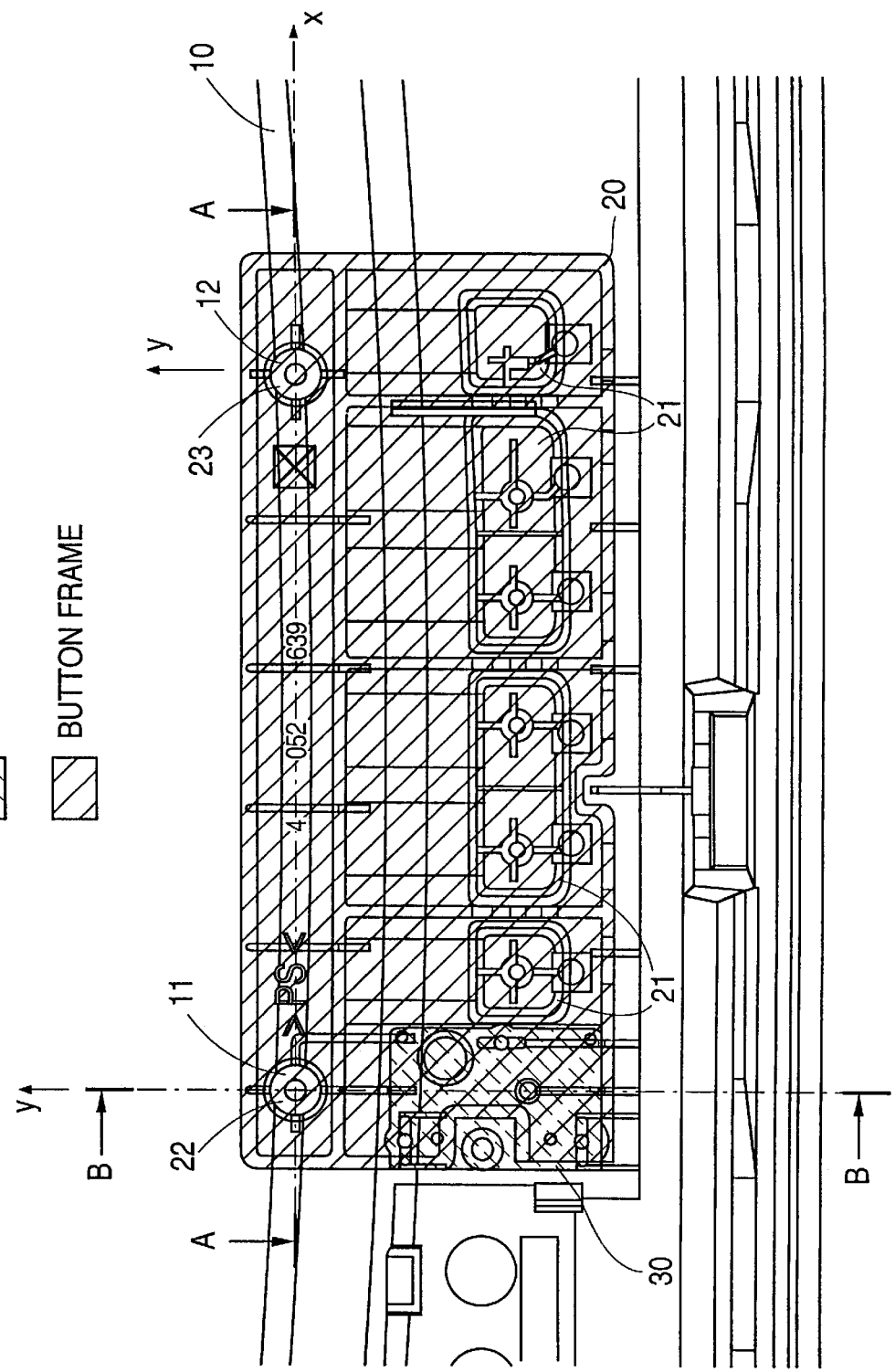

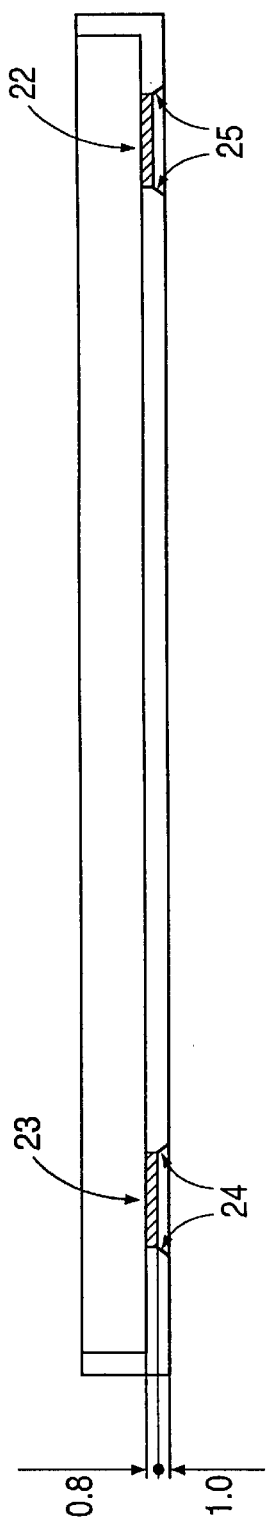
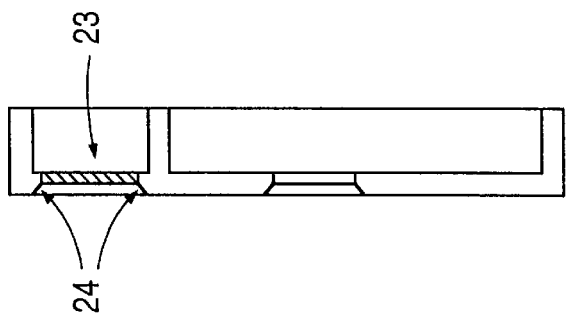
FIG. 2A
FIG. 2B

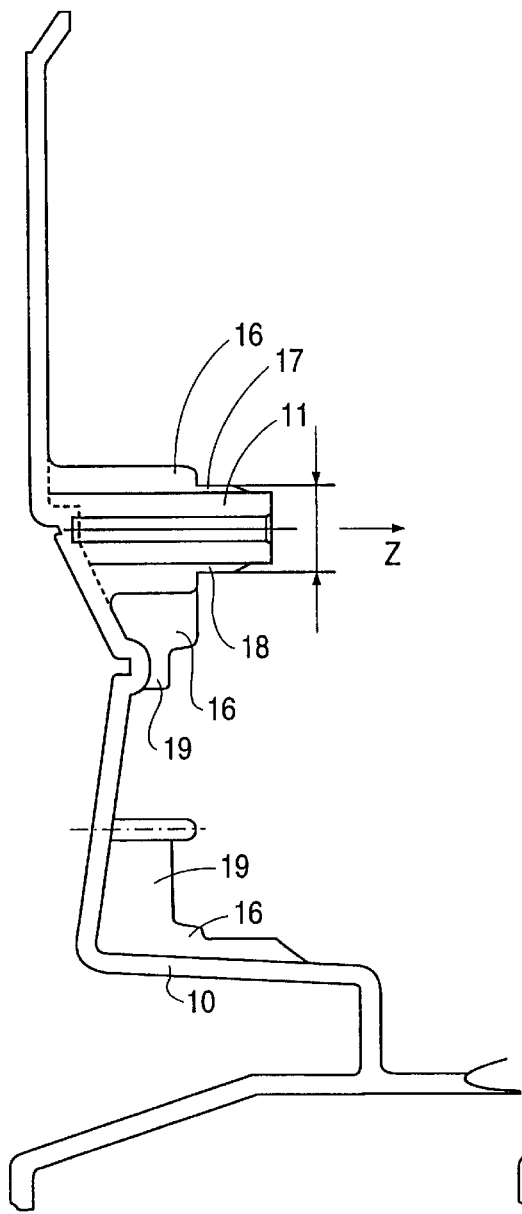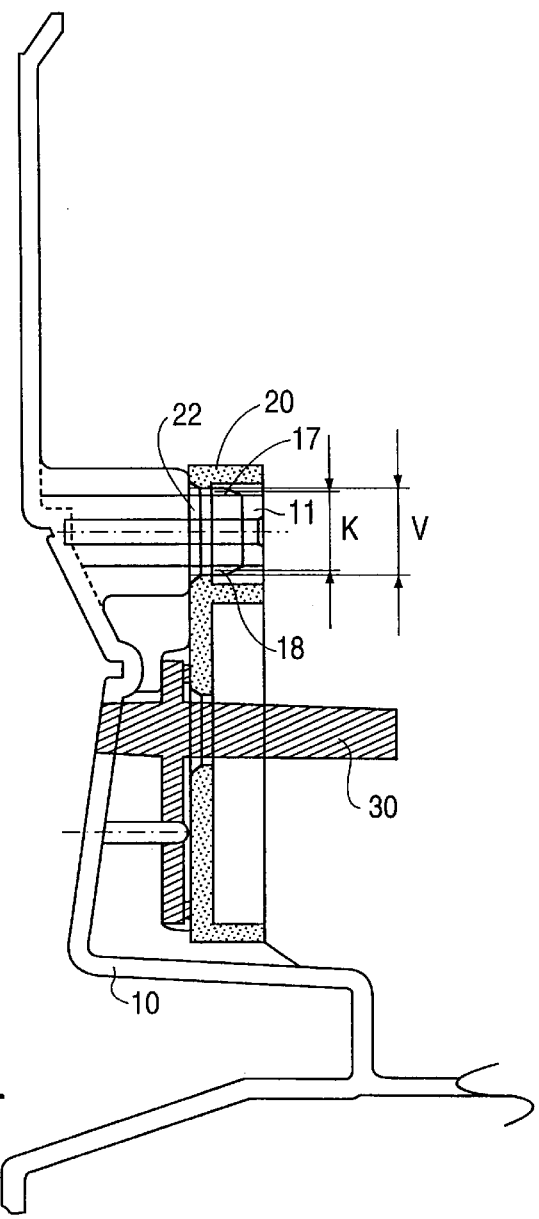

MOUNTING ASSEMBLY AND METHOD FOR LOCATING AND ASSEMBLING PARTS WITH A TIGHT PRESS FIT

BACKGROUND OF THE INVENTION

1. Field of the Invention

The present invention relates generally to a mounting assembly and assembly method and, more specifically, to a mounting assembly and assembly method for connecting two mating parts of an assembly together with a tight press fit.

2. Description of the Related Art

Common methods for connecting parts in the assembly of consumer and non-consumer electronics, computers, home appliances, and the like, include fastening the parts using glue, screws or clips. Other methods for securing such an assembly include the use of a dowel or a post to expand material upon joining two parts to form a secure connection.

A significant drawback of these conventional methods is the complexity and increased production costs involved in using fastening aids such as glue, screws or clips in the assembly.

Another significant drawback in the conventional methods is that if any of the individual mating parts of the assembly are slightly irregular or formed outside of dimensional tolerance, the mating parts may no longer be able to be connected. A common example of this often arises when a screw hole of one mating piece is not aligned with the receiving screw hole of the corresponding mating piece. As a result of even a slight variation in the production of either mating piece, connection can be made difficult, if not impossible.

Therefore, there is a need for a connection method that reduces both the production time and costs associated with the assembly process. There is also a need for a mounting assembly that allows for a greater tolerance in manufacturing variations of the individual mating parts.

SUMMARY OF THE INVENTION

It is an object of the present invention to provide a mounting assembly and method for connecting mating parts of an assembly without using conventional fastening aids such as glue, screws, or clips to fasten or secure the assembly.

It is a further object of the present invention to provide a mounting assembly and assembly method that results in reduced defects in final assembly by increasing the tolerance and allowing increased variations in the manufacturing of individual mating parts of the assembly.

Additional objects, advantages and novel features of the invention will be set forth in the description which follows, and will become apparent to those skilled in the art upon reading this description or practicing the invention. The objects and advantages of the invention may be realized and attained by the appended claims.

To achieve the foregoing and other objects and in accordance with the purposes of the present invention, as embodied and broadly described herein, a mounting assembly is provided that comprises a first mating part having first and second mating holes, and a second mating part having first and second bosses for connection with the first and second mating holes of the first mating part, respectively. The first and second mating parts are connected together such that an interference fit is provided between the first and second bosses and the first and second mating holes, respectively, on opposite sides of each of the first and second bosses along a respective first axis, but not along a second axis which is perpendicular to the first axis.

The second axis preferably passes through a center of both of the first and second bosses, whereby a greater tolerance is provided in the distance between the first and second bosses and the first and second mating holes, respectively.

The first and second bosses preferably each have first and second ribs on opposite sides of each boss along the first axis, the first and second ribs spanning a distance that is larger than a diameter of the first and second mating holes, respectively, thereby providing an interference fit between the ribs and the first and second mating holes. The first boss preferably has third and fourth ribs on opposite sides thereof along the second axis, the third and fourth ribs spanning a distance that is approximately equal to the diameter of the first mating hole, thereby providing a non-interference fit between the third and fourth ribs and the first mating hole. A gap is preferably formed between the second boss and the second mating hole on opposite sides of the first boss along the second axis, the gap permitting relative movement between the first mating part and the second boss along the second axis. The first and second mating holes each preferably have a lead in chamfer to facilitate insertion of the first and second bosses, respectively.

A third assembly part can be sandwiched between the first and second mating parts. In a preferred embodiment, the first mating part is a button frame, the second mating part is a cabinet, and the third mating part is a light guide.

According to a further aspect of the present invention, the objects and purpose of the invention are achieved by a method for assembling mating parts with a tight press fit. The method comprises the steps of providing a first mating part having first and second mating holes, providing a second mating part having first and second bosses for connection with the first and second mating holes of the first mating part, respectively, and connecting the first and second mating parts together such that an interference fit is provided between the first and second bosses and the first and second mating holes, respectively, on opposite sides of each of the first and second bosses along a respective first axis, but not along a second axis which is perpendicular to the first axis.

BRIEF DESCRIPTION OF THE DRAWINGS

The present invention will become more clearly appreciated as the disclosure of the present invention is made with reference to the accompanying drawings. In the drawings:

FIG. 1 is a plan view of the inside or core side of a mounting assembly according to a preferred embodiment of the present invention showing a cabinet, a button frame, and a light guide as disclosed herein;

FIG. 2A is a cross section view of the button frame along the line A—A as seen in FIG. 1;

FIG. 2B is a cross section view of the button frame along the line B—B as seen in FIG. 1;

FIG. 4A is a cross section view of the cabinet along the line B—B as seen in FIG. 1; and FIG. 4B is a cross section view of the cabinet, button frame, and light guide along the line B—B as seen in FIG. 1.

DETAILED DESCRIPTION OF THE INVENTION

Figures 3A, 3B:
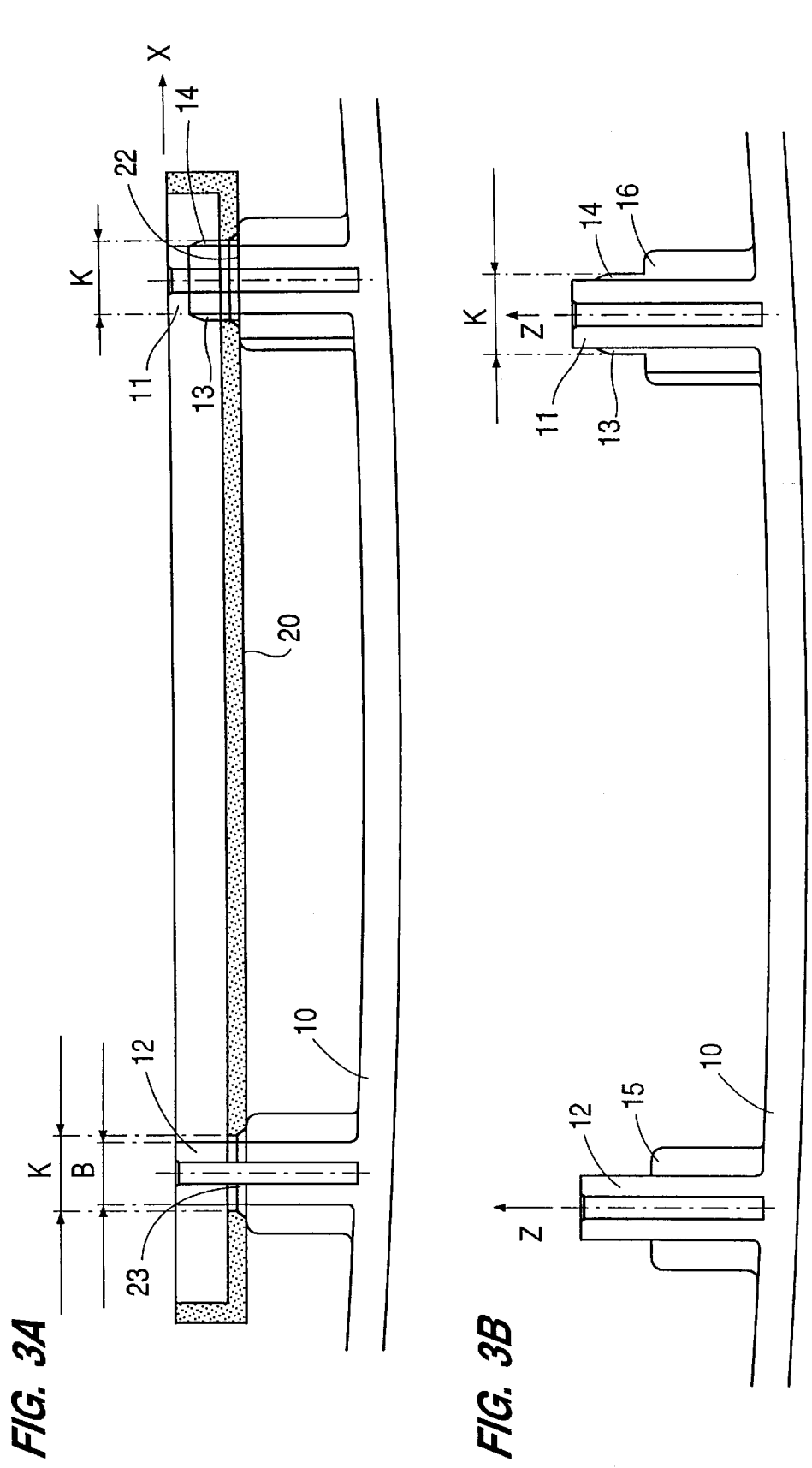
FIG. 3A is a cross section view of the cabinet and the button frame along the line A—A as seen in FIG. 1.
FIG. 3B is a cross section view of the cabinet along the line A—A as seen in FIG. 1.

Reference will now be made in detail to a preferred embodiment of the invention, an example of which is illustrated in the accompanying drawings.

FIG. 1 is a plan view of the inside (core side) of the mounting assembly according to the present invention. The mounting assembly includes a cabinet 10, a button frame 20, and a light guide component 30 sandwiched between the button frame 20 and the core side of the cabinet 10.

The cabinet 10 is provided with a first boss 11 and a second boss 12 extending from the core side of the cabinet 10. The button frame 20 is provided with a plurality of push buttons 21 movably attached to the button frame 20. The button frame 20 also includes a first mating hole 22 and a second mating hole 23 for interconnection with the first and second bosses 11 and 12, respectively.

A horizontal x-axis is defined as an axis passing through the center of both of the first and second bosses 11, 12. A vertical y-axis is defined at each of the first and second bosses 11 and 12 as being perpendicular to the horizontal x-axis, as seen in the plan view of FIG. 1. A z-axis is defined at each of the first and second bosses 11, 12 as being perpendicular to the horizontal x-axis in a direction along the longitudinal axis of the bosses 11, 12.

FIG. 2A provides a cross section view of the button frame 20 along the line A—A of FIG. 1. FIG. 2B provides a cross section view of the button frame 20 along the line B—B of FIG. 1. As shown in FIGS. 2A and 2B, the button frame 20 includes two mating holes 22 and 23, respectively. Each mating hole 22, 23 has a lead-in chamfer section 24 and 25, respectively, in the form of a beveled edge or corner to facilitate installation of a mating piece (i.e., the boss piece) into the hole 22, 23.

FIG. 3A is a cross section view of an assembly of the cabinet and the button frame along the line A—A of FIG. 1. As seen in FIG. 3A, the bosses 11 and 12 of the cabinet 10 are connected to the mating holes 22 and 23 of the button frame 20, respectively. Of the two bosses 11 and 12, only boss 11 has first and second horizontal ribs 13, 14 formed on diametrically mutually opposing sides of the boss along the x-axis. As indicated in FIG. 3A, the distance spanning the first and second horizontal ribs 13, 14 is a length K, which is preferably equal to a diameter of the mating holes 22, 23 on the button frame 20 (i.e., no interference fit).

The other boss 12 of the cabinet 10 is not provided with horizontal ribs. While the mating hole 23 of the button frame 20, which corresponds to the boss 12, still has a diameter K, the diameter B of the boss 12 is somewhat smaller, as indicated in FIG. 3A. Thus, a gap results between the button frame mating hole 23 and the boss 12. The gap allows the button frame 20 to move relative to the boss 12 in a direction along the x-axis, thereby providing greater tolerance in the distance between the mating holes 22 and 23 and between the bosses 11 and 12, respectively.

FIG. 3B provides a view similar to FIG. 3A, except that the button frame 20 has been removed from the cabinet 10 to emphasize the structure of the core side of the cabinet 10. As shown in FIG. 3B, stoppers 15 and 16 are provided on each boss 11 and 12, respectively, which are used to limit movement of the button frame 20 in a z-axis direction (i.e., along the longitudinal axes of the bosses 11, 12).

FIG. 4A is a cross section view of the cabinet 10 along line B—B of FIG. 1. As shown in FIG. 4A, the boss 11 is provided with first and second vertical ribs 17, 18. The other boss 12 is provided with similar vertical ribs. The first and second vertical ribs 17, 18 are provided on diametrically opposing mutual sides of the bosses 11, 12 in a y-axis direction. The stopper 16 is shown in FIG. 4A for stopping the button frame 20 from moving in a z-axis direction. Also shown is a stopper 19 for stopping the light guide 30 from moving in a z-axis direction.

FIG. 4B provides a cross section view along line B—B of the cabinet 10, button frame 20, and light guide 30 in an assembled state. FIG. 4B provides a view similiar to that of FIG. 4A, except that the button frame 20 is shown connected to the cabinet 10, and the light guide 30 is sandwiched between the cabinet 10 and the button frame 20. As described above, the mating holes 22, 23 of the button frame 20 each have a diameter K. A distance spanning the two vertical ribs 17, 18 of the boss 11 is shown in FIG. 4B as length V. This is the case for both of the bosses 11 and 12. The mating hole diameter K is smaller that the length V, thereby providing an interference fit between the bosses 11, 12 and the mating holes 22, 23, respectively. For example, the diameter K may be 8.0 mm and the length V may be 8.3 mm, thereby resulting in a total interference between the bosses and mating holes of 0.3 mm.

As described above, the dimensions of the vertical ribs 17, 18 result in an interference fit between the mating holes 22, 23 and the cabinet bosses 11, 12 when the button frame 20 and the cabinet 10 are connected together. When the button frame 20 is forced upon the ribs 17, 18 of the bosses 11, 12, the vertical ribs 17, 18 are "crushed" (i.e., compressed, but not destroyed) and a tight fit is thereby created.

The lead-in chamfer 24, 25 of the holes 22, 23 in the button frame 20 may, for example, measure 1.0 mm, and an average wall thickness of the holes 22, 23 may, for example, be 1.8 mm. The vertical ribs 17, 18 each preferably have a width of approximately 1.2 mm. In this case, the actual area of the 0.3 mm interference between the vertical ribs 17, 18 and the mating holes 22, 23 would be 0.8 mm (1.8–1.0) by 1.2 mm×2 ribs.

It is important to note that a variety of dimensions could be utilized according to the concept of the present invention for obtaining and maintaining an interference fit between the components. The larger the interference fit between the mating parts, the tighter the parts fit together. However, if the interference is too large, the parts become more difficult to mate.

Another benefit of the instant invention is the ability to sandwich parts between mating parts. For example, in FIG. 4B the light guide 30 is shown sandwiched between the cabinet 10 and the button frame 20. During assembly, the light guide 30 is first placed against the inner core side of the cabinet 10, and then the button frame 20 is press-fit connected to the cabinet bosses 11, 12. The tight fit between the button frame 20 and the cabinet 10 allows the light guide 30 to be held securely in place without the need for screws, glue or other conventional fixing means.

This connection method can be used for a variety of applications including, for example, the assembling of buttons to a TV cabinet without the use of screws or other conventional fixing means. The present invention uses an intentional design interference fit between the two mating parts which crushes the vertical ribs on the cabinet bosses when the button frame is forced upon the cabinet bosses. The x-axis horizontal rib arrangement of the one cabinet boss does not cause interference, but rather allows for variations outside the normal dimensional tolerances in the production of the individual mating parts, thereby resulting in lower defects at the production line.

This embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A mounting assembly, comprising:

a first member having first and second mating holes;

a second member having first and second bosses for extending into and mating with said first and second holes of said first member, respectively; and first and second ribs extending from opposite sides of said first boss along a line defined by said first and second mating holes;

wherein a total width of said ribs is substantially equal to a diameter of said first mating hole; and wherein said first and second ribs, when inserted in said first mating hole serve to align said second boss with said second mating hole along a direction of said line.

2. A mounting assembly as claimed in claim 1, wherein said first mating hole has a chamfered openings to facilitate reception of said first boss.

3. A mounting assembly as claimed in claim 1, wherein said first boss further comprises a stopper which abuts an outer surface of said first mating hole when said first boss is engaged in said first mating hole.

4. A mounting assembly as claimed in claim 1, wherein said second boss does not have ribs extending along the direction of said line.

5. A mounting assembly as claimed in claim 1, further comprising third and fourth ribs disposed on said first boss, said third and fourth ribs having a total width greater than said diameter of said first mating hole, wherein said third and fourth ribs are deformable to create an interference fit between said first boss and said first mating hole.

6. A mounting assembly as claimed in claim 5, wherein said third and fourth ribs are disposed opposite each other on said first boss along a line perpendicular to said line along which said first and second ribs extend.

7. A mounting assembly as claimed in claim 1, further comprising fifth and sixth ribs disposed on said second boss, said fifth and sixth ribs having a total width greater than a diameter of said second mating hole, wherein said fifth and sixth ribs are deformable to create an interference fit between said second boss and said second mating hole.

8. A mounting assembly as claimed in claim 7, wherein said fifth and sixth ribs are disposed opposite each other on said second boss.

9. A mounting assembly as claimed in claim 1, wherein said second mating hole has a chamfered openings to facilitate reception of said second boss.

10. A mounting assembly as claimed in claim 1, wherein said second boss further comprises a stopper which abuts an outer surface of said second mating hole when said second boss is engaged in said second mating hole.

11. A mounting assembly as claimed in claim 1, wherein said second mating member further comprises a stopper for abutting and maintaining a position of a third member between said first and second members when said first and second member are mated.

12. A method of engaging a first member having first and second mating holes with a second member having first and second bosses in a mounting assembly, comprising aligning said second mating hole on said first member with said second boss on said second member by partially inserting said first boss into said first mating hole, wherein said first boss comprises first and second ribs with a total width substantially equal to a diameter of said first mating hole such that when a portion of said first and second ribs on said first boss is inserted in said first mating hole, said second boss and second mating hole are aligned with respect to a line defined by said first and second mating holes.

13. A method as claimed in claim 12, further comprising chamfering an opening of said first mating hole to facilitate reception of said first boss.

14. A method as claimed in claim 12, further comprising limiting entry of said first boss into said first mating hole with a stopper disposed on said first boss which abuts an outer surface of said first mating hole when said first boss is engaged in said first mating hole.

15. A method as claimed in claim 12, further comprising providing no ribs on said second boss along a direction of said line such that said alignment has a tolerance equal to a difference between a diameter of said second boss and a diameter of said second mating hole.

16. A method as claimed in claim 12, further comprising deforming third and fourth ribs disposed on said first boss by inserting said first boss in said first mating hole, wherein said third and fourth ribs have a total width greater than said diameter of said first mating hole such that an interference fit between said first boss and said first mating hole is created by said deforming of said third and fourth ribs.

17. A method as claimed in claim 16, wherein said third and fourth ribs are disposed opposite each other on said first boss along a line perpendicular to said line along which said first and second ribs extend.

18. A method as claimed in claim 12, further comprising deforming fifth and sixth ribs disposed on said second boss by inserting said second boss in said second mating hole, wherein said fifth and sixth ribs have a total width greater than said diameter of said second mating hole such that an interference fit between said second boss and said second mating hole is created by said deforming of said fifth and sixth ribs.

19. A method as claimed in claim 18, wherein said fifth and sixth ribs are disposed opposite each other on said second boss.

20. A method as claimed in claim 12, further comprising sandwiching and maintaining a third member between said first and second members using a stopper for abutting and maintaining a position of said third member between said first and second members when said first and second member are mated.

* * * * *